(12) United States Patent
Teene

(10) Patent No.: US 7,003,753 B2
(45) Date of Patent: Feb. 21, 2006

(54) METHOD OF GENERATING A PHYSICAL NETLIST FOR A HIERARCHICAL INTEGRATED CIRCUIT DESIGN

(75) Inventor: Andres Teene, Fort Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 285 days.

(21) Appl. No.: 10/718,291

(22) Filed: Nov. 19, 2003

(65) Prior Publication Data

US 2005/0108672 A1 May 19, 2005

(51) Int. Cl.
*G06F 17/50* (2006.01)

(52) U.S. Cl. .............................. 716/12; 716/11; 716/17

(58) Field of Classification Search ................ 716/1, 716/11, 12, 17

See application file for complete search history.

(56) References Cited

U.S. PATENT DOCUMENTS 5,777,529 A * 7/1998 Lowe ........................... 333/33

* cited by examiner

*Primary Examiner*—Thuan Do
(74) *Attorney, Agent, or Firm*—Fitch, Even, Tabin & Flannery

(57) ABSTRACT

A method of generating a physical netlist for an integrated circuit design includes steps of: (a) receiving as input a representation of a core cell for a hierarchical integrated circuit design; (b) generating a physical netlist for a core cell model tile that maps logical ports of the core cell to physical ports of the core cell model tile; (c) including values for parasitic resistances connecting the logical ports of the core cell to the physical ports of the core cell model tile in the physical netlist for the core cell model tile; (d) connecting a hierarchical array of core cell model tiles so that the physical ports of each core cell model tile are connected to one another inside the array or mapped to an input/output port of the hierarchical array of core cell model tiles; and (e) generating as output a physical netlist of the hierarchical array of core cell model tiles.

10 Claims, 8 Drawing Sheets

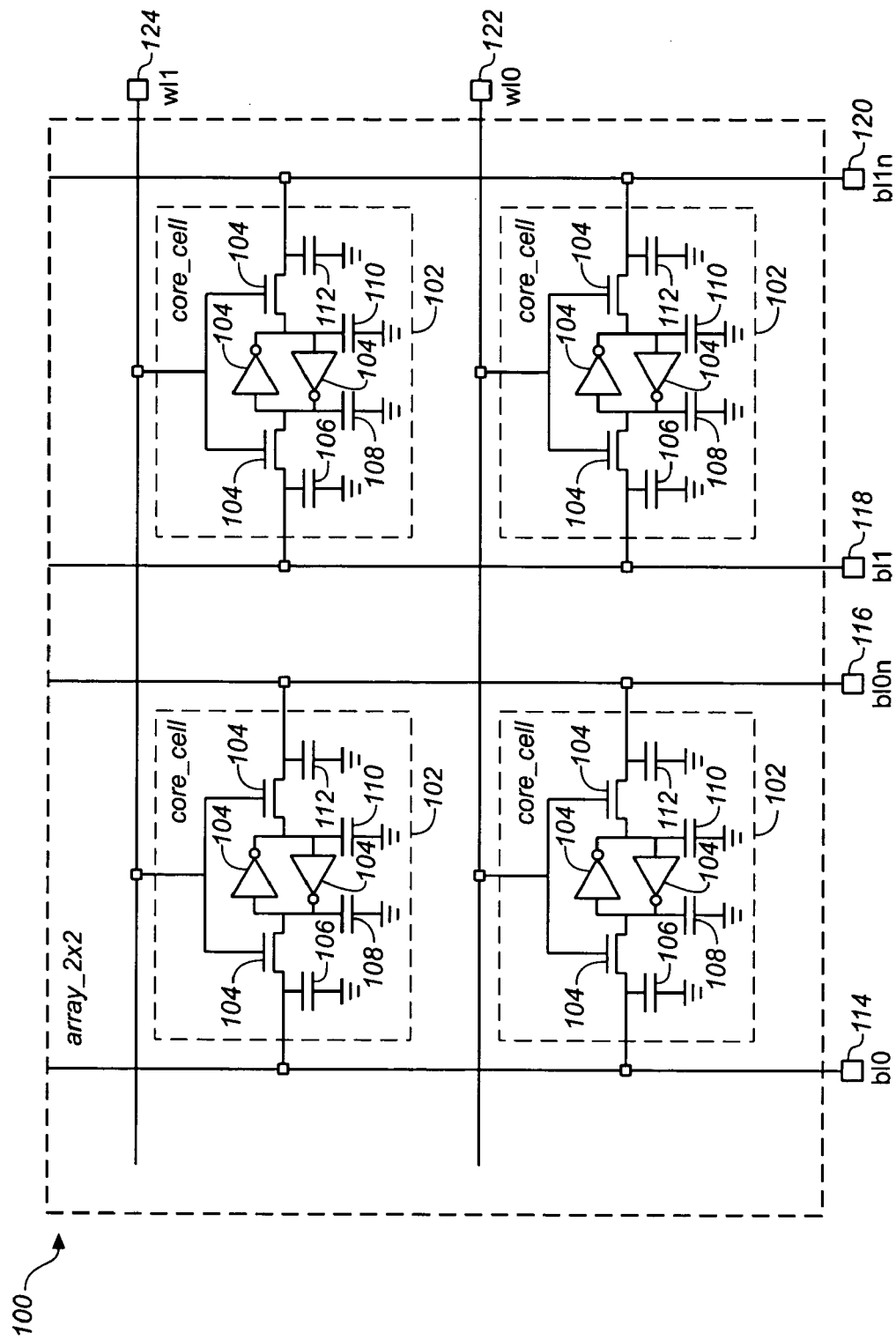
FIG._1
(PRIOR ART)

```
.subckt array2x2 wl0 wl1 bl0 bl0n bl1 bl1n
X00 wl0 bl0 bl0n core_cell
X01 wl0 bl1 bl1n core_cell
X10 wl1 bl0 bl0n core_cell
X11 wl1 bl1 bl1n core_cell
.ends
.subckt core_cell wl bla blan
t0 bla  wl n0 vss nm
t1 blan wl n1 vss nm
t2 n1 n0 vdd vdd pm
t3 n1 n0 vss vss nm
t4 n0 n1 vdd vdd pm
t5 n0 n1 vss vss nm
cp1 bla vss
cp2 blan vss
cp3 wl vss
cp4 n0 vss
cp5 n1 vss
.ends
```
*FIG._2 (PRIOR ART)*
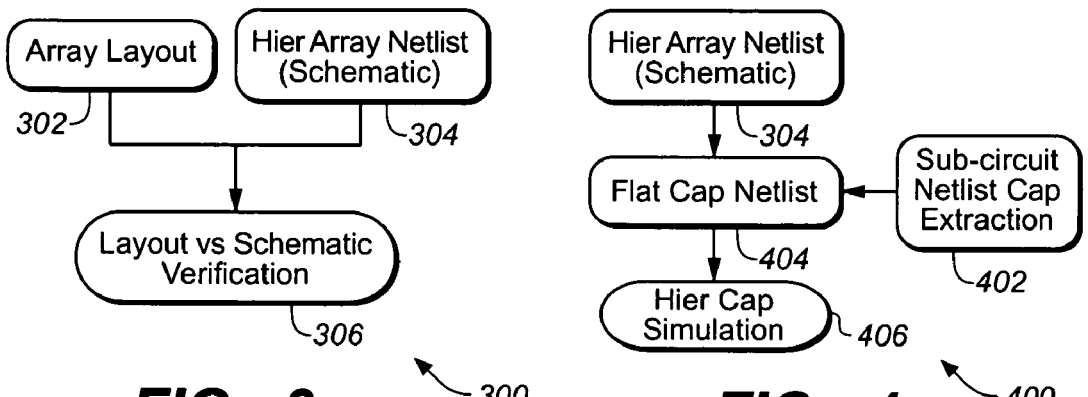
*FIG._3 (PRIOR ART)*
*FIG._4 (PRIOR ART)*
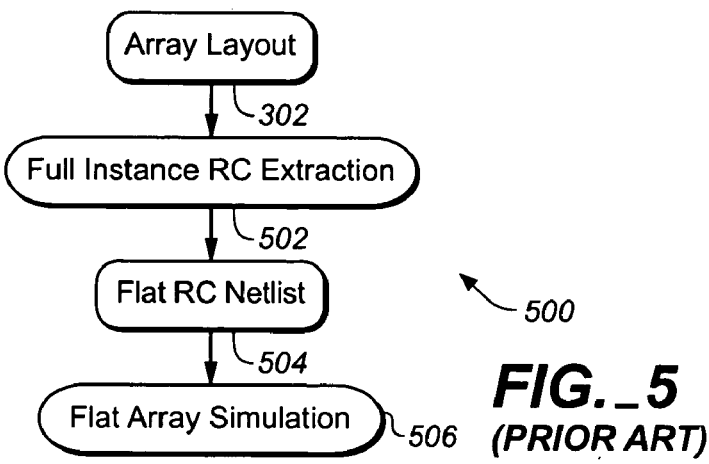
*FIG._5 (PRIOR ART)*

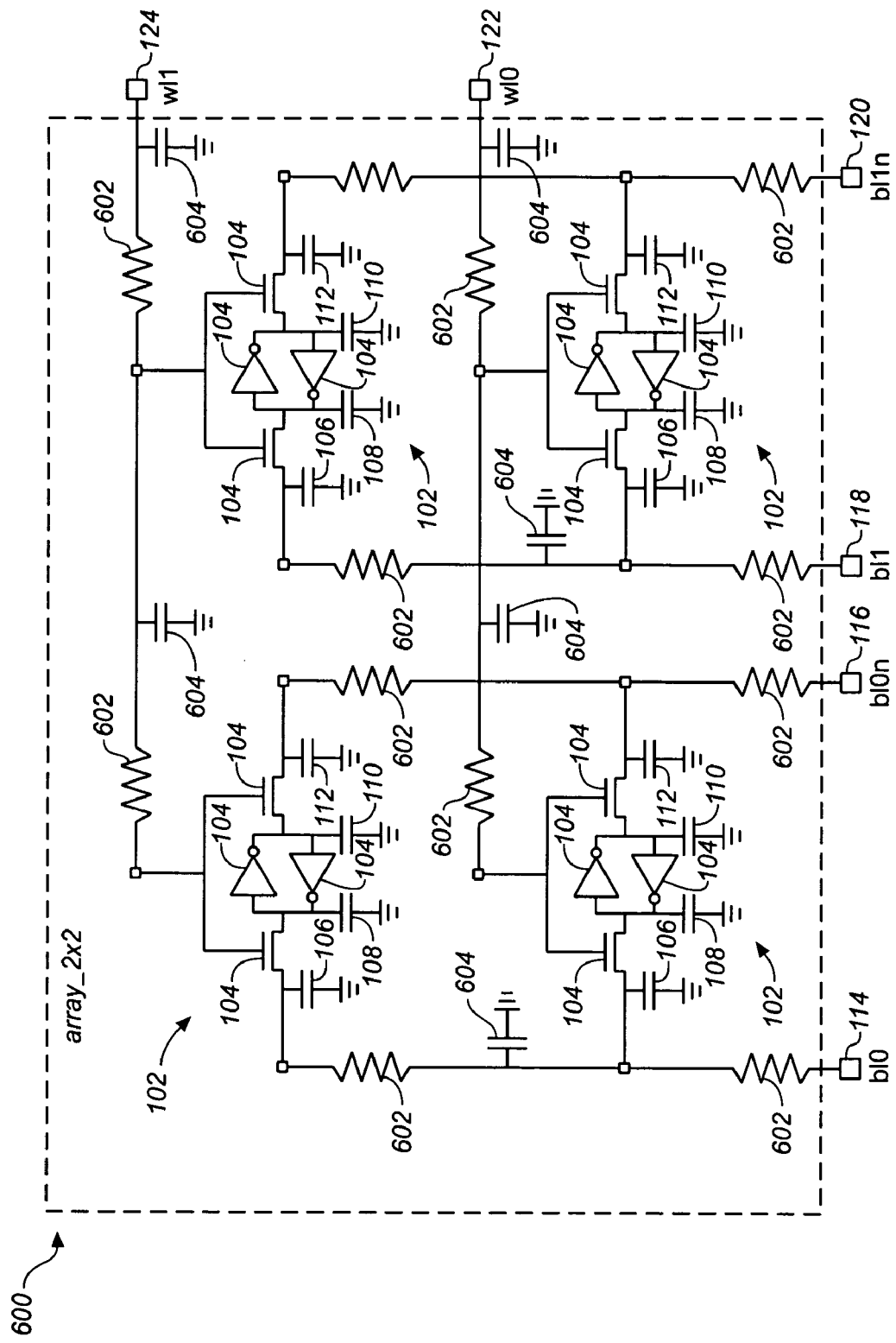
FIG._6
(PRIOR ART)

```
.subckt array2x2 w10 w11 bl0 bl0n bl1 bl1n
t00 n2  n1  n4  vss nm
t01 n3  n1  n5  vss nm
t02 n5  n4  vdd vdd pm
t03 n5  n4  vss vss nm
t04 n4  n5  vdd vdd pm
t05 n4  n5  vss vss nm
t06 n7  n6  n9  vss nm
t07 n8  n6  n10 vss nm
t08 n10 n9  vdd vdd pm
t09 n10 n9  vss vss nm
t10 n9  n10 vdd vdd pm
t11 n9  n10 vss vss nm
t12 n12 n11 n14 vss nm
t13 n13 n11 n15 vss nm
t14 n15 n14 vdd vdd pm
t15 n15 n14 vss vss nm
t16 n14 n15 vdd vdd pm
t17 n14 n15 vss vss nm
t18 n17 n16 n19 vss nm
t19 n18 n16 n20 vss nm
t20 n20 n19 vdd vdd pm
t21 n20 n19 vss vss nm
t22 n19 n20 vdd vdd pm
t23 n19 n20 vss vss nm
r00 w10 n1
c00 n1  vss
r01 n1  n11
c01 n11 vss
r02 w11 n6
c02 n6  vss
...
.ends
```

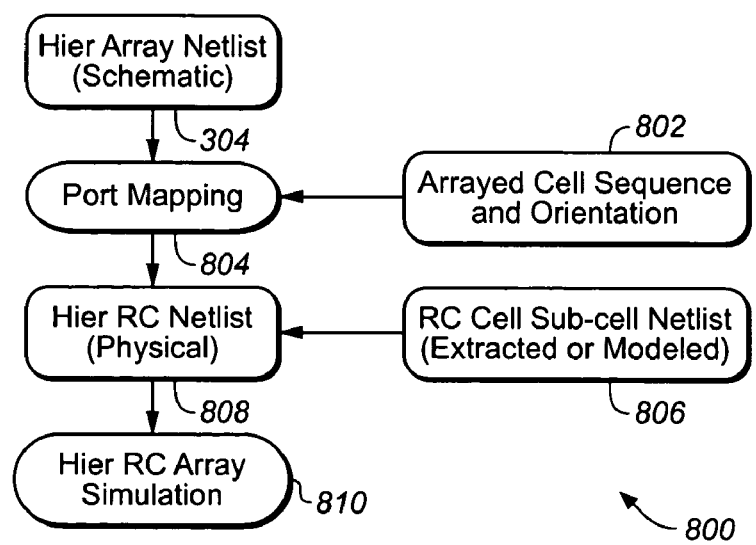

FIG._8

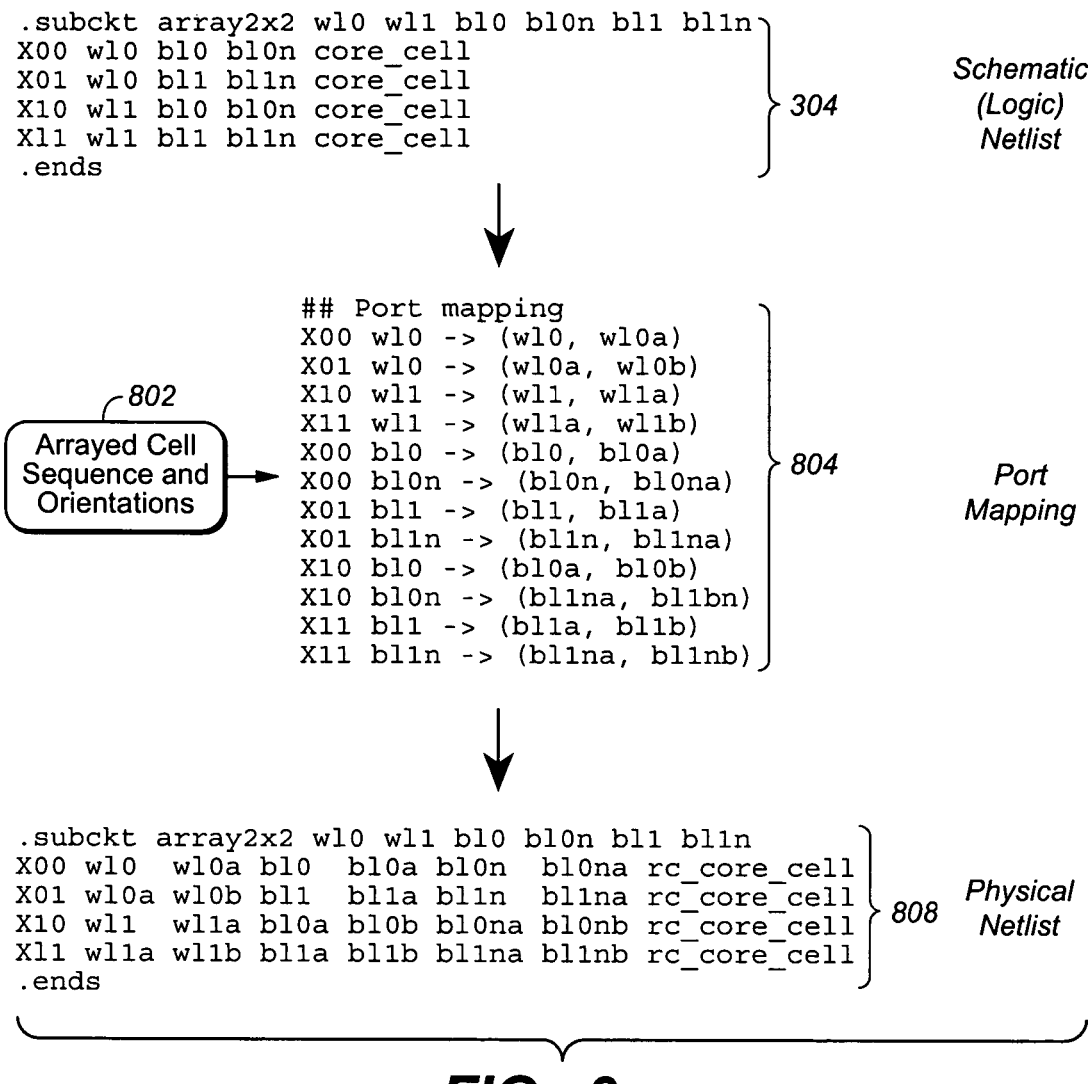
FIG._9

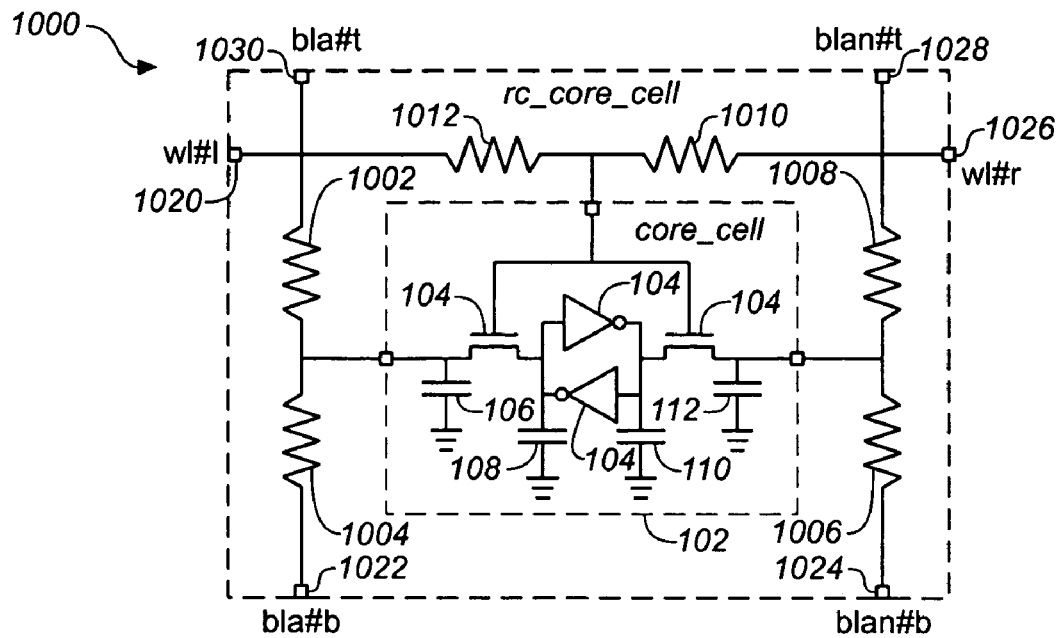
FIG._10
```
.subckt rc_core_cell wl#r wl#l bla#b bla#t blan#b blan#t
r1 wl#r wl
r2 wl#l wl
r3 bla#b bla
r4 bla#t bla
r5 blan#b blan
r6 blan#t blan
x1 wl bla blan core_cell
.ends
```
⬉ 1100
FIG._11
```
.subckt array2x2 wl0 wl1 bl0 bl0n bl1 bl1n
X00 wl0   wl0a bl0   bl0a bl0n   bl0na rc_core_cell
X01 wl0a  wl0b bl1   bl1a bl1n   bl1na rc_core_cell
X10 wl1   wl1a bl0a  bl0b bl0na  bl0nb rc_core_cell
X11 wl1a  wl1b bl1a  bl1b bl1na  bl1nb rc_core_cell
.ends
```
⬉ 1300
FIG._13

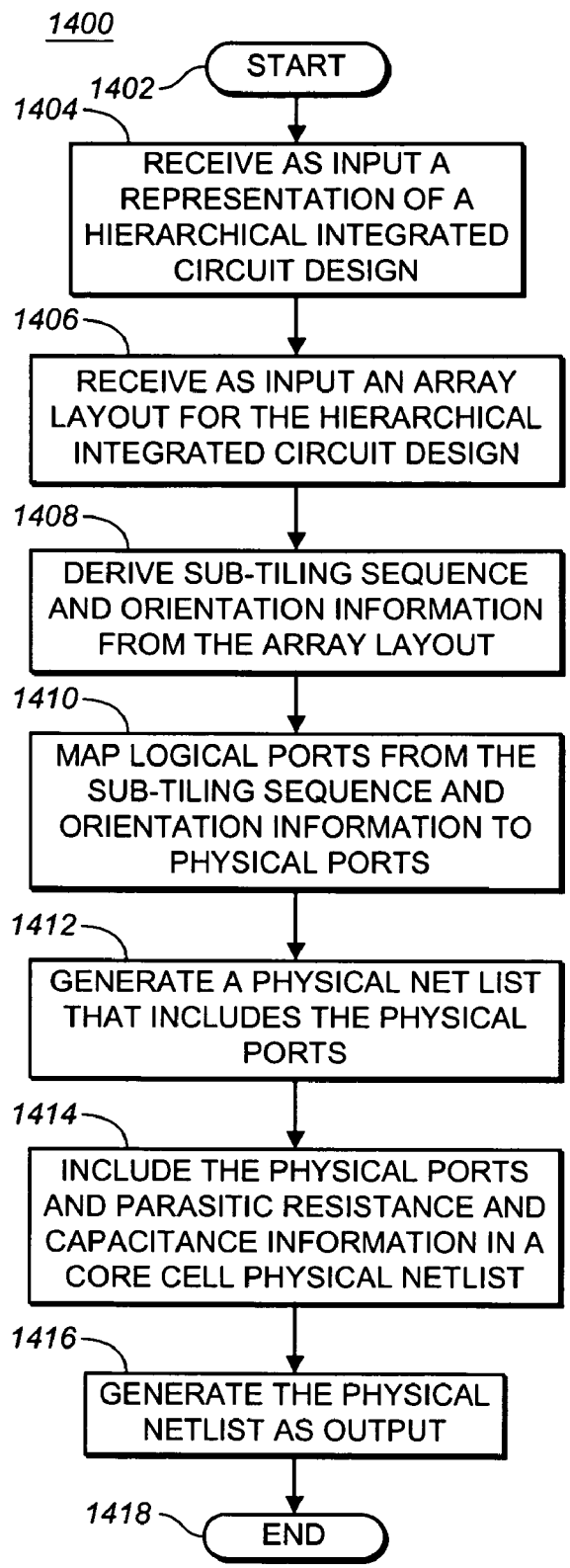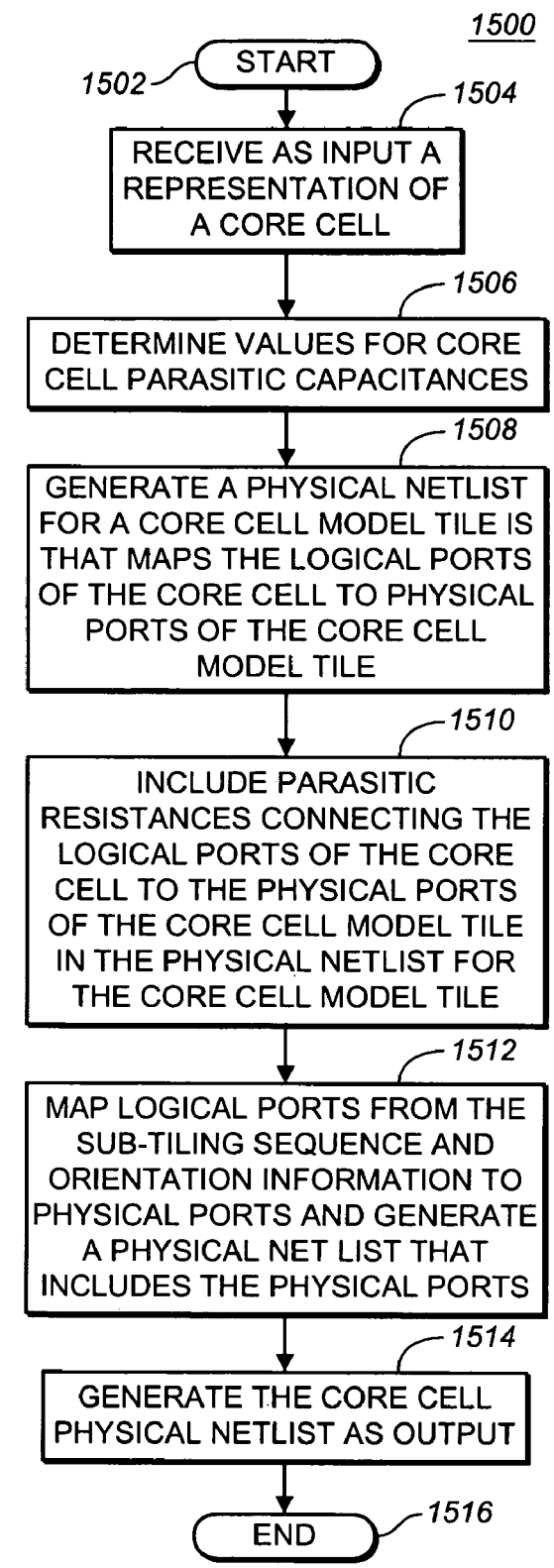

METHOD OF GENERATING A PHYSICAL NETLIST FOR A HIERARCHICAL INTEGRATED CIRCUIT DESIGN

BACKGROUND OF THE INVENTION

1. Field of the Invention

The present invention relates generally to the design of integrated circuits. More specifically, but without limitation thereto, the present invention relates to methods of representing an integrated circuit design for simulating the operation of the integrated circuit.

2. Description of Related Art

Previous methods of simulating application specific integrated circuit (ASIC) functions are based on logical schematic netlists and RC (resistance and capacitance) extraction. Accurate simulation and analysis of large structured arrays in sub-micron technologies, such as memories and datapaths, generally require back-annotation of RC parasitics. The RC parasitics are the resistance and capacitance values of the interconnections between components in the integrated circuit that are important to an accurate simulation of the operation of the integrated circuit. Simulations of large structured arrays typically include only capacitance values or RC simulations of selected portions of specific nets in a large structured array.

SUMMARY OF THE INVENTION

In one aspect of the present invention, a method of generating a physical netlist for an integrated circuit design includes steps of:

(a) receiving as input a representation of a core cell for a hierarchical integrated circuit design;

(b) generating a physical netlist for a core cell model tile that maps logical ports of the core cell to physical ports of the core cell model tile;

(c) including values for parasitic resistances connecting the logical ports of the core cell to the physical ports of the core cell model tile in the physical netlist for the core cell model tile;

(d) connecting a hierarchical array of core cell model tiles so that the physical ports of each core cell model tile are connected to one another inside the array or mapped to an input/output port of the hierarchical array of core cell model tiles; and (e) generating as output a physical netlist of the hierarchical array of core cell model tiles.

In another aspect of the present invention, a computer program product for generating a physical netlist for an integrated circuit design includes:

a medium for embodying a computer program for input to a computer; and a computer program embodied in the medium for causing the computer to perform steps of:

(a) receiving as input a representation of a core cell for a hierarchical integrated circuit design;

(b) generating a physical netlist for a core cell model tile that maps logical ports of the core cell to physical ports of the core cell model tile;

(c) including values for parasitic resistances connecting the logical ports of the core cell to the physical ports of the core cell model tile in the physical netlist for the core cell model tile;

(d) connecting a hierarchical array of core cell model tiles so that the physical ports of each core cell model tile are connected to one another inside the array or mapped to an input/output port of the hierarchical array of core cell model tiles; and (e) generating as output a physical netlist of the hierarchical array of core cell model tiles.

BRIEF DESCRIPTION OF THE DRAWINGS

The present invention is illustrated by way of example and not limitation in the accompanying figures, in which like references indicate similar elements throughout the several views of the drawings, and in which:

FIG. 1 illustrates a typical hierarchical array 100 of the prior art;

FIG. 2 illustrates a typical netlist for the hierarchical array of FIG. 1;

FIG. 3 illustrates a flow diagram for the layout vs. schematic verification of a hierarchical integrated circuit design according to the prior art;

FIG. 4 illustrates a flow diagram for simulating a hierarchical integrated circuit design including only capacitance based on a logical netlist according to the prior art;

FIG. 5 illustrates a flow diagram for simulating a flat integrated circuit design according to the prior art;

FIG. 6 illustrates a flat schematic extracted from the hierarchical schematic of FIG. 1 according to the prior art;

FIG. 7 illustrates a typical flat RC physical netlist generated from the RC extraction in FIG. 5;

FIG. 8 illustrates a flow diagram for simulating a hierarchical integrated circuit design including both capacitance and resistance according to an embodiment of the present invention;

FIG. 9 illustrates an example of a physical netlist port mapping for the flow diagram of FIG. 8;

FIG. 10 illustrates a core cell model tile according to an embodiment of the present invention;

FIG. 11 illustrates a hierarchical schematic netlist for the resistance and capacitance core cell model of FIG. 10;

FIG. 13 illustrates a physical netlist for the hierarchical integrated circuit design of FIG. 12;

FIG. 14 illustrates a flow chart for a method of generating a physical netlist for a hierarchical integrated circuit according to an embodiment of the present invention; and FIG. 15 illustrates a flow chart for a method of generating a physical netlist from a core cell model for a hierarchical integrated circuit design according to an embodiment of the present invention.

Figure 12:
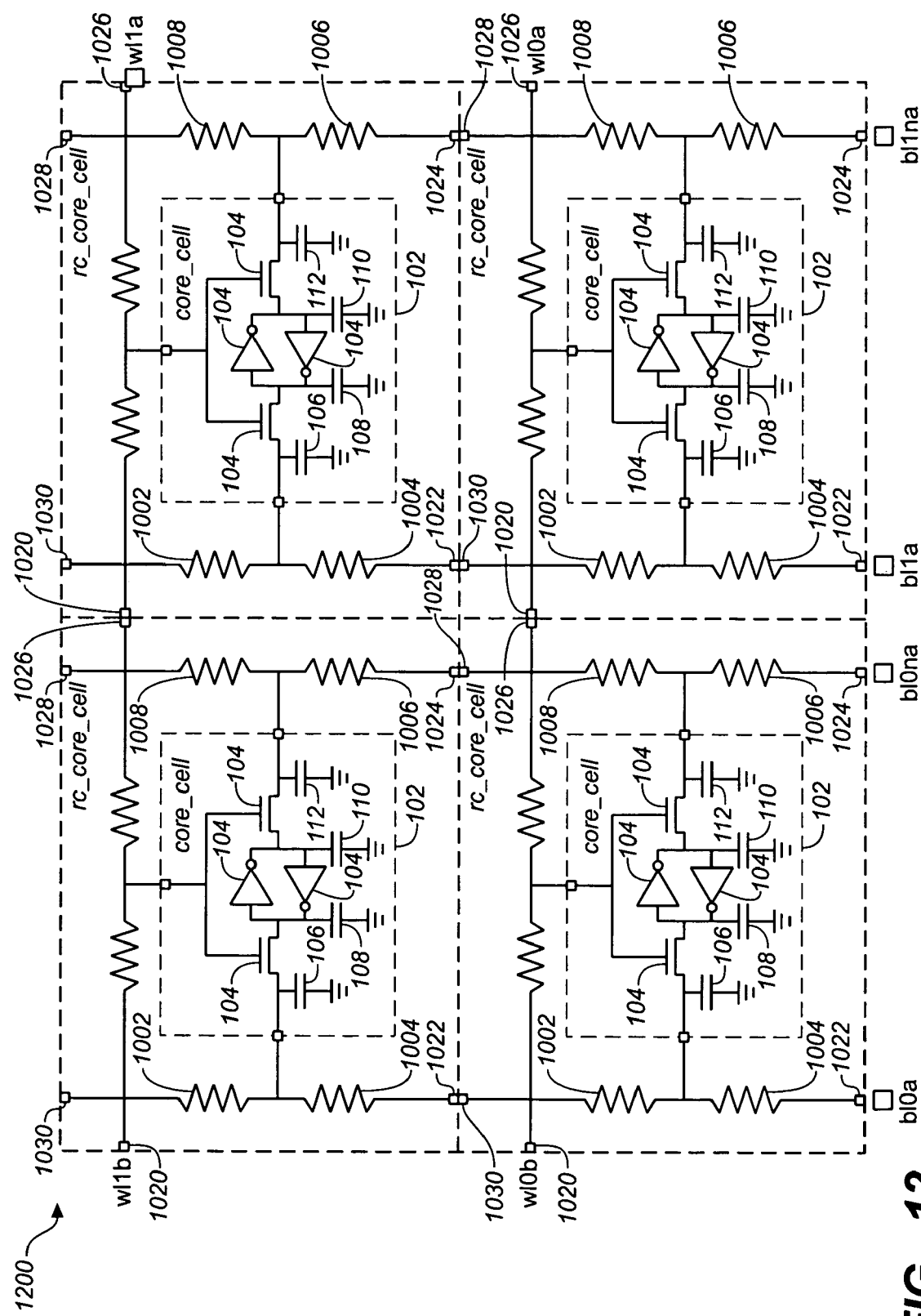
FIG. 12 illustrates a hierarchical integrated circuit design including both capacitance and resistance based on the hierarchical schematic netlist of FIG. 11.

Elements in the figures are illustrated for simplicity and clarity and have not necessarily been drawn to scale. For example, the dimensions of some elements in the figures may be exaggerated relative to other elements to point out distinctive features in the illustrated embodiments of the present invention.

DESCRIPTION OF THE ILLUSTRATED EMBODIMENTS

Integrated circuit designs are typically tested by a computer simulation of the integrated circuit design from a schematic netlist. A schematic or logical netlist describes the logical connection of hierarchical elements in an integrated circuit design. The hierarchical elements are cells or modules that are replicated to construct circuit blocks. The circuit blocks are replicated to construct larger circuit blocks or circuit modules, and so on for each level of the hierarchy.

Previous methods typically used to simulate integrated circuit designs for application specific integrated circuits (ASIC) are based on a resistance and capacitance extraction from a logical schematic netlist. The logical schematic netlist describes the logical connection of cells used to construct function modules constituting the integrated circuit design as illustrated in FIGS. 1 and 2.

FIG. 1 illustrates a typical hierarchical array 100 of the prior art. Shown in FIG. 1 are core cells 102, sub-cells 104, parasitic capacitances 106, 108, 110 and 112, and input/output ports 114, 116, 118, 120, 122 and 124.

In the example of FIG. 1, the core cells 102 are replicated to constitute a 2×2 hierarchical array. The core cells 102 are connected to one another inside the hierarchical array 100 and to the input/output ports 114, 116, 118, 120, 122 and 124.

FIG. 2 illustrates a typical netlist 200 for the hierarchical array 100 of FIG. 1. Shown in FIG. 2 are a logical netlist 202 for the hierarchical array 100 and a physical netlist 204 for the core cell 102.

The logical netlist 202 describes the connections between the core cells 102 and the input/output ports 114, 116, 118, 120, 122 and 124 of the hierarchical array 100. The physical netlist 204 describes the connections between the sub-cells 104 and the parasitic capacitances 106, 108, 110 and 112. The representation of the integrated circuit design in FIG. 1 illustrated by the netlist 200 is typically used by computer simulation tools for functional simulations and layout vs. schematic verification as shown in FIGS. 3 and 4.

FIG. 3 illustrates a flow diagram 300 for the layout vs. schematic verification of a hierarchical integrated circuit design according to the prior art. Shown in FIG. 3 are an array layout block 302, a logical or schematic netlist block 304 of a hierarchical array, and a layout vs. schematic verification block 306.

In the array layout block 302, the physical design or layout of a hierarchical integrated circuit design is generated. In the hierarchical array netlist block 304, the components and interconnections of the array layout block 302 are expressed in schematic language. In the layout versus schematic verification block 306, the physical design is verified to ensure that the physical design satisfies the timing requirements of the hierarchical array netlist 304.

FIG. 4 illustrates a flow diagram 400 for simulating a hierarchical integrated circuit design including only capacitance based on a logical netlist according to the prior art. Shown in FIG. 4 are a logical or schematic netlist block 304 of a hierarchical array, a sub-circuit netlist capacitance extraction block 402, a flat capacitance netlist block 404, and a hierarchical capacitance simulation block 406.

In the sub-circuit netlist capacitance extraction block 402, a capacitance extraction netlist is generated for each core cell in the integrated circuit design. In the hierarchical capacitance simulation block 406, the effects of the capacitances extracted for each cell in the integrated circuit design are simulated.

The functional simulation of FIG. 4 may include parasitic capacitance but generally does not include all the parasitic resistances, capacitances, and inductances that are required for accurate simulation of the integrated circuit design. Accurate simulation and design analysis of large structured arrays typically produced in sub-micron technologies generally require back-annotation of the netlist to include parasitic resistance and capacitance. For arrays such as memories and datapaths, a flat resistance and capacitance extraction is generally required as shown in FIG. 5.

FIG. 5 illustrates a flow diagram 500 for simulating a flat integrated circuit design according to the prior art. Shown in FIG. 5 are an array layout block 302, a full instance resistance and capacitance extraction block 502, a flat resistance and capacitance netlist 504, and a flat array simulation block 506.

In the full instance resistance and capacitance extraction block 502, a layout extraction is performed to determine the values of all the parasitic capacitances and resistances in the integrated circuit design to generate the flat RC netlist for simulating the operation of the integrated circuit. The full instance resistance and capacitance extraction block 502 is an extremely computer-intensive task. The method of generating a physical netlist for an integrated circuit design of the present invention advantageously avoids this time-consuming expenditure of computer resources.

A flat integrated circuit design expands a hierarchical array so that each instance of a core cell is replicated in the physical netlist. For example, a core cell may be defined once at a lower level of a hierarchical array and referenced only once by a higher level of the hierarchical array to generate a physical netlist for a large structured array. As a result, the physical netlist for a hierarchical array is generally compact relative to the circuit design it represents. On the other hand, the physical netlist for a flat integrated circuit design includes a description for every core cell in the array, resulting in a file size that may be thousands of times larger than that for the hierarchical array for the same integrated circuit design. The simulation of the flat integrated circuit design uses a flat schematic netlist or back-annotation file that is orders of magnitude larger than the hierarchical netlist.

FIG. 6 illustrates a flat schematic 600 extracted from the hierarchical schematic of FIG. 1 according to the prior art. Shown in FIG. 6 are core cells 102, sub-cells 104, parasitic capacitances 106, 108, 110 and 112, input/output ports 114, 116, 118, 120, 122 and 124, port parasitic resistances 602, and port parasitic capacitances 604. Even though the arrangements and values of many components in the flat schematic 600 are replicated, each component in the flat netlist is described as if it were unique.

FIG. 7 illustrates a typical flat RC physical netlist 700 generated from the RC extraction in FIG. 5. As will be described below, the size of the physical netlist 700 may be advantageously reduced by the method of the present invention. The flat RC netlist is typically generated in the full instance resistance and capacitance extraction block 502, which generally requires a correspondingly large amount of CPU time, resulting in higher costs and turnaround time. Also, the large flat netlists are difficult to simulate and are unable to exploit the advantages of the hierarchical simulation capabilities of commercially available circuit simulators.

The method of generating a physical netlist for an integrated circuit design of the present invention overcomes the disadvantages of flat extraction methods for resistance and capacitance simulations of large structured arrays by generating a core cell model that includes parasitic resistance and capacitance and may also include parasitic inductance. The core cell model of the present invention may be included in a hierarchical netlist that may readily be simulated by currently available software tools for functional verification, timing analysis, and chip level simulation.

In one aspect of the present invention, a method of generating a physical netlist for an integrated circuit design includes steps of:

(a) receiving as input a representation of a core cell for a hierarchical integrated circuit design;

(b) generating a physical netlist for a core cell model tile that maps logical ports of the core cell to physical ports of the core cell model tile;

(c) including values for parasitic resistances connecting the logical ports of the core cell to the physical ports of the core cell model tile in the physical netlist for the core cell model tile;

(d) connecting a hierarchical array of core cell model tiles so that the physical ports of each core cell model tile are connected to one another inside the array or mapped to an input/output port of the hierarchical array of core cell model tiles; and (e) generating as output a physical netlist of the hierarchical array of core cell model tiles.

FIG. 8 illustrates a flow diagram 800 for simulating a hierarchical integrated circuit design including both capacitance and resistance according to an embodiment of the present invention. Shown in FIG. 8 are a logical netlist for a hierarchical array 304, an arrayed cell sequence and orientation block 802, a port mapping block 804, a resistance and capacitance sub-cell netlist 806, a hierarchical resistance and capacitance physical netlist 808, and a hierarchical resistance and capacitance array simulation 810.

In the array cell sequence and orientation block 802, the physical information for the core cells is received as input, including their locations, orientation, and sequence required to perform the port mapping. In the port mapping block 804, the logical ports in the schematic netlist are mapped to the physical ports in the physical netlist, or layout. In the hierarchical resistance and capacitance physical netlist 808, the hierarchical physical netlist is generated, which includes the physical port connections.

FIG. 9 illustrates an example of a physical netlist port mapping for the flow diagram of FIG. 8. Shown in FIG. 9 are a logical netlist 304, an arrayed cell sequence and orientation block 802, a port mapping netlist 804, and a hierarchical resistance and capacitance physical netlist 808 expressed in netlist language format.

FIG. 10 illustrates a core cell model tile 1000 according to an embodiment of the present invention. Shown in FIG. 10 are a core cell 102, sub-cells 104, parasitic capacitances 106, 108, 110 and 112, core cell model parasitic resistances 1002, 1004, 1006 and 1008, and core cell model ports 1020, 1022, 1024, 1026, 1028 and 1030.

A physical netlist for the core cell model tile 1000 may be generated by mapping the logical ports of the core cell 102 to the physical ports of the core cell model tile 1000 so that multiple core cell model tiles may be conveniently connected to one another. In the example of FIG. 10, the logical ports of the core cell 102 are mapped to the physical ports 1020, 1022, 1024, 1026, 1028 and 1030. The parasitic resistances connecting the logical ports of the core cell 102 to the physical ports of the core cell model tile 1000 are included in the physical netlist for the core cell model tile 1000. In addition to the parasitic resistances, parasitic inductances and capacitances may also be included in the core cell model tile 1000 according to well known techniques.

FIG. 11 illustrates a hierarchical schematic netlist 1100 for the core cell model tile 1000 of FIG. 10. The hierarchical schematic netlist 1100 describes the connection of the logical ports of the core cell 102 to the physical ports of the core cell model tile 1000.

FIG. 12 illustrates a hierarchical integrated circuit design 1200 including both capacitance and resistance based on the hierarchical schematic netlist 1100 of FIG. 11. Shown in FIG. 12 are core cells 102, sub-cells 104, parasitic capacitances 106, 108, 110 and 112, core cell model parasitic resistances 1002, 1004, 1006 and 1008, core cell model ports 1020, 1022, 1024, 1026, 1028 and 1030, and input/output ports w10$a$, w10$b$, w11$a$, w11$b$, b10$a$, b10$na$, b11$a$ and b11$na$.

In the hierarchical integrated circuit design 1200, multiple core cell model tiles 1000 are tiled or arranged in a hierarchical array 1200 so that the physical ports of the core cell model tiles 1000 are connected to one another inside the hierarchical array 1200 or to the input/output ports w10$a$, w10$b$, w11$a$, w11$b$, b10$a$, b10$na$, b11$a$ and b11$na$.

FIG. 13 illustrates a physical netlist 1300 for the hierarchical integrated circuit design 1200 of FIG. 12. The description of the hierarchical array 1200 by the physical netlists 1100 and 1300 is significantly smaller than the physical netlist 700 for the corresponding flat array 600 in FIG. 6.

FIG. 14 illustrates a flow chart 1400 for a method of generating a physical netlist for a hierarchical integrated circuit according to an embodiment of the present invention.

Step 1402 is the entry point of the flow chart 1400.

In step 1404, a representation of a hierarchical integrated circuit design, for example, a logical netlist, is received as input.

In step 1406, an array layout for the hierarchical integrated circuit design is received as input.

In step 1408, sub-tiling sequence and orientation information are derived from the array layout as described above with reference to FIG. 8.

In step 1410, logical ports from the sub-tiling sequence and orientation information are mapped to physical ports as described above with reference to FIG. 8.

In step 1412, a physical netlist is generated that includes the physical ports as illustrated in the example of FIG. 9.

In step 1414, the physical ports and parasitic resistance and capacitance information from, for example, a sub-circuit model or a resistance and capacitance cell level extraction, is included in a sub-cell physical netlist. Inductance may also be included in the sub-cell physical netlist.

In step 1416, the physical netlist is generated as output.

Step 1418 is the exit point of the flow chart 1400.

Alternatively, a physical netlist for a hierarchical integrated circuit design may be generated directly from a hierarchical core cell model tile constructed in the manner of FIG. 10 that includes parasitic resistance and capacitance.

FIG. 15 illustrates a flow chart 1500 for a method of generating a physical netlist from a core cell model for a hierarchical integrated circuit design according to an embodiment of the present invention.

Step 1502 is the entry point of the flow chart 1500.

In step 1504, a representation of a core cell for a hierarchical integrated circuit design is received as input. In the example of FIG. 10, the logical netlist for the core cell 102 including sub-circuit cells 104 is received according to well known techniques, for example, from a cell library for a selected integrated circuit technology.

In step 1506, values for the core cell parasitic capacitances are determined, for example, by performing a parasitic extraction or by retrieving the values for the parasitic capacitances from a cell library. In the example of FIG. 10, the core cell parasitic capacitances 106, 108, 110 and 112 for the core cell 102 are included in the cell library.

In step 1508, a physical netlist for a core cell model tile is generated that maps the logical ports of the core cell to physical ports of the core cell model tile so that multiple core cell model tiles may be conveniently connected to one another. In the example of FIG. 10, the logical ports of the core cell 102 are mapped to the physical ports 1020, 1022, 1024, 1026, 1028 and 1030.

In step 1510, parasitic resistances connecting the logical ports of the core cell to the physical ports of the core cell model tile are included in the physical netlist for the core cell model tile. In the example of FIG. 10, the parasitic resistances 1002, 1004, 1006, 1008, 1010 and 1012 connect the ports of the core cell 102 to the physical ports of the core cell model tile. The values of the parasitic resistances may be determined according to well known techniques and included in a core cell model library. In addition, parasitic inductance of the connections between the core cell ports and the physical ports of the core cell model tile may be determined according to well known techniques and included in the physical netlist.

The physical netlist for the core cell model tile of FIG. 10 is illustrated in FIG. 11. In FIG. 11, each of the parasitic resistances r1, r2, r3, r4, r5 and r6 corresponds respectively to the parasitic resistances 1010, 1012, 1002, 1004, 1006 and 1008 in the schematic of FIG. 10. The port mapping is described in steps 1512 and 1514.

In step 1512, core cell model tiles are arranged or tiled in an array so that the physical ports of each core cell model tile are connected to one another inside the array or mapped to an input/output port of the array in the physical netlist as described above with respect to steps 1410 and 1412 in FIG. 14. In the example of FIG. 12, the hierarchical array 1200 has input/output ports w10a, w10b, w11a, w11b, b10a, b10na, b11a and b11na. An example of a physical netlist for the hierarchical array in the example of FIG. 12 is illustrated in FIG. 13.

In step 1514, the physical netlist of the hierarchical array is generated as output. The hierarchical physical netlist may be used by currently available circuit simulation and timing analysis tools, advantageously reducing the time and costs associated with flat circuit designs.

Step 1516 is the exit point of the flow chart 1500.

Although the method of the present invention illustrated by the flowchart descriptions above are described and shown with reference to specific steps performed in a specific order, these steps may be combined, sub-divided, or reordered without departing from the scope of the claims. Unless specifically indicated herein, the order and grouping of steps is not a limitation of the present invention.

The steps described above with regard to the flow charts described above may also be implemented by instructions performed on a computer according to well-known computer programming techniques.

In another aspect of the present invention, a computer program product for generating a physical netlist for an integrated circuit design includes:

a medium for embodying a computer program for input to a computer; and a computer program embodied in the medium for causing the computer to perform steps of:

(a) receiving as input a representation of a core cell for a hierarchical integrated circuit design;

(b) generating a physical netlist for a core cell model tile that maps logical ports of the core cell to physical ports of the core cell model tile;

(c) including values for parasitic resistances connecting the logical ports of the core cell to the physical ports of the core cell model tile in the physical netlist for the core cell model tile;

(d) connecting a hierarchical array of core cell model tiles so that the physical ports of each core cell model tile are connected to one another inside the array or mapped to an input/output port of the hierarchical array of core cell model tiles; and (e) generating as output a physical netlist of the hierarchical array of core cell model tiles.

While the invention herein disclosed has been described by means of specific embodiments and applications thereof, numerous modifications and variations could be made thereto by those skilled in the art without departing from the scope of the invention set forth in the following claims.

What is claimed is:

1. A method of generating a physical netlist for an integrated circuit design including steps of:

(a) receiving as input a representation of a core cell for a hierarchical integrated circuit design;

(b) generating a physical netlist for a core cell model tile that maps logical ports of the core cell to physical ports of the core cell model tile;

(c) including values for parasitic resistances connecting the logical ports of the core cell to the physical ports of the core cell model tile in the physical netlist for the core cell model tile;

(d) connecting a hierarchical array of core cell model tiles so that the physical ports of each core cell model tile are connected to one another inside the array or mapped to an input/output port of the hierarchical array of core cell model tiles; and (e) generating as output a physical netlist of the hierarchical array of core cell model tiles.

2. The method of claim 1 wherein step (c) further comprises including values for parasitic inductances connecting the logical ports of the core cell to the physical ports of the core cell model tile in the physical netlist for the core cell model tile.

3. The method of claim 1 wherein step (c) further comprises including values for parasitic capacitances of the core cell in the physical netlist for the core cell model tile.

4. The method of claim 1 further comprising a step (f) of simulating the integrated circuit design from the physical netlist.

5. The method of claim 4 further comprising a step (g) of performing a timing analysis of the integrated circuit design from the physical netlist.

6. A computer program product for generating a physical netlist for an integrated circuit design comprising:

a medium for embodying a computer program for input to a computer; and a computer program embodied in the medium for causing the computer to perform steps of:

(a) receiving as input a representation of a core cell for a hierarchical integrated circuit design;

(b) generating a physical netlist for a core cell model tile that maps logical ports of the core cell to physical ports of the core cell model tile;

(c) including values for parasitic resistances connecting the logical ports of the core cell to the physical ports of the core cell model tile in the physical netlist for the core cell model tile;

(d) connecting a hierarchical array of core cell model tiles so that the physical ports of each core cell model tile are connected to one another inside the array or mapped to an input/output port of the hierarchical array of core cell model tiles; and (e) generating as output a physical netlist of the hierarchical array of core cell model tiles.

7. The computer program product of claim 6 wherein step (c) further comprises including values for parasitic inductances connecting the logical ports of the core cell to the physical ports of the core cell model tile in the physical netlist for the core cell model tile.

8. The computer program product of claim 6 wherein step (c) further comprises including values for parasitic capacitances of the core cell in the physical netlist for the core cell model tile.

9. The computer program product of claim 6 further comprising a step (f) of simulating the integrated circuit design from the physical netlist.

10. The computer program product of claim 9 further comprising a step (g) of performing a timing analysis of the integrated circuit design from the physical netlist.

* * * * *